United States Patent [19]

Ferris

[11] 4,334,157
[45] Jun. 8, 1982

[54] DATA LATCH WITH ENABLE SIGNAL GATING

[75] Inventor: David A. Ferris, West Buxton, Me.

[73] Assignee: Fairchild Camera and Instrument Corp., Mountain View, Calif.

[21] Appl. No.: 123,717

[22] Filed: Feb. 22, 1980

[51] Int. Cl.³ .................... H03K 3/288; H03K 17/00
[52] U.S. Cl. ................................. 307/291; 307/480; 307/247 R; 365/154; 365/205
[58] Field of Search ............. 307/291, 289, 456, 473, 307/480, 238.4, 238.6, 247 R; 365/154, 177, 205

[56] References Cited

U.S. PATENT DOCUMENTS

| | | | |
|---|---|---|---|
| 3,609,705 | 9/1971 | Mercy | 307/238.6 |
| 3,751,683 | 8/1973 | Drost | 307/291 X |
| 3,764,920 | 10/1973 | Galcik et al. | 307/480 |
| 3,845,330 | 10/1974 | Colonel | 307/291 |
| 4,112,296 | 9/1978 | Heimbigner et al. | 307/291 |
| 4,160,173 | 7/1979 | Aoki | 307/480 |

Primary Examiner—John Zazworsky
Attorney, Agent, or Firm—Paul J. Winters; Theodore S. Park; Warren M. Becker

[57] ABSTRACT

A data latch of the kind having at least two operative modes, a transmitting or transparent mode or condition for transmitting data signals through the latch, and a latching mode or condition for latching and temporary storage by feedback of data signals in the latch. According to the invention there is provided in the data latch a pregate for pregating feedback signals in the latch. The pregate is adapted and coupled to provide positive feedback data signals for reinforcing previously entered data in the latching mode, and gating signals for passing input data in the transmitting mode.

14 Claims, 6 Drawing Figures

DATA LATCH WITH ENABLE SIGNAL GATING

Field of the Invention

This invention relates to new and improved data latching devices operable in either of two modes for transmitting data signals or temporarily storing data signals and useful in data processing systems such as microprocessor based systems and applications where presently available data is temporarily stored until needed.

BACKGROUND OF THE INVENTION

A data latching device, data latch or D latch as referred to herein is a "flip-flop" type device generally used following data generating circuitry to permit temporary storage of currently available data until it is needed. For example in microprocessor based systems where a peripheral to be controlled by the microprocessor is not ready, the microprocessor output data is latched until the peripheral is ready to receive the data while the microprocessor goes on to other calculations. Such data latching devices have at least two modes or states of operation, a transmitting or transparent mode or state for transmitting data signals from the latch input to the output, and a latching mode or state for latching and temporary storage of data previously received at the input. Latch enable gating signals appropriately applied to gates within the latch effect operation and switching between the two modes.

A typical application of such data latches is illustrated in FIG. 2 where is shown an "octal transparent latch" 10 consisting of eight data latches 12, eight tristate output devices or buffers 14, a latch enable signal source LE with inverting delay 15, and output enable signal source OE with inverting delay 16. Such a package of eight latches with eight output buffers is particularly suited for commonly used applications with eight bits to a byte. When a high level voltage appears at the latch enable LE, the latches 12 are in the transparent or transmitting state and data input signals for example in the form of high or low level voltages representing binary 1 and 0 at the inputs $D_0$ through $D_7$ are passed through and appear at the outputs $O_0$ through $O_7$. Each latch inverts the signal into it as does each buffer 14 so that the outputs at $O_0$–$O_7$ are in phase with the inputs at $D_0$–$D_7$. When the latch enable LE is at low level voltage data previously entered is latched or temporarily stored unchanged in the latches 12 until LE returns to a high level binary "1".

In this application the output buffers 14 perform a number of functions. First, the latch output is a high impedance node and the output buffer 14 transforms impedance to a low impedance node compatible with TTL (transistor-transistor logic) circuits in which the latch can function as an internal device. Additionally, the output buffer devices 14 illustrated in FIG. 2 are tristate output devices with a high impedance third state for applications in which many outputs are tied to a common bus, not shown. When a low level signal $\overline{OE}$ appears at the output buffers 14 after inversion by inverting delay 16 of a high level signal OE from the output enable, the output gates function as bistate devices delivering high and low level voltages to drive the common bus. When $\overline{OE}$ is high, tristate output buffers 14 are in the high impedance third state exhibiting a high impedance at the common bus to external circuitry. Further background on such TTL tristate output devices is found in copending U.S. patent applications Ser. No. 005,929, Ser. No. 005,928, and Ser. No. 058,674, all assigned to the assignee of the present invention, namely Fairchild Camera & Instrument Corporation, Mountain View, Calif.

DESCRIPTION OF THE PRIOR ART

A conventional prior art data latching device or "D latch" 20 is illustrated in the logic diagram of FIG. 1 in which the latch itself is enclosed within the dashed box 22 with supporting circuitry outside. Such a prior art latch includes a data input D and input data gate G3 for receiving and gating input signals to the latch, and feedback gate G4 for gating feedback data signals from the output Y. Because the latch is inverting, that is the output Y is the inverse of the input signal D, an inverting delay G6 is provided in the feedback line to feedback gate G4 in order to provide positive feedback for latching as hereafter described. The outputs of the data gate G3 and the feedback gate G4 pass through a disjunctive gate G5, in this case a NOR gate for passing either an input data signal or a feedback data signal according to whether the latch is in the transmitting state or latching state as further described.

Control signals X1 and X2 for controlling and switching the state or mode of operation of the latch for either transmitting or latching are derived from the latch enable signal LE through inverting delay gates G1 and G2. Gates G1 and G2 additionally buffer the input so that many latches can be controlled without additionally loading the input. Thus, control sigal X1 is the inverse and out of phase with the latch enable signal LE while the control signal G2 after a double inversion is logically the same and in phase with the latch enable signal LE. Because control signals X1 and X2 are logical inverses of each other and are applied to AND gates G3 and G4, the data gate G3 is enabled to pass input data signals when the feedback gate G4 is disabled and blocking the feedback signal, and vice versa. Thus, when LE is at high level voltage or logical binary 1, the latch is in the transmitting or transparent state, the high level voltage signal X2 enabling the AND input data gate G3 to pass input data signals to the output Y. At the same time, the low level signal X1 disables AND gate G4 blocking the inverted feedback signal from output Y. When LE is at low level voltage the latch is in the latching or temporary storage state or mode, low level control signal X2 blocking the data transmission at gate G3 and high level signal X1 enabling AND gate G4 to pass positive feedback signals from the output Y so that the previously entered binary value reinforces itself for latching or temporarily storing the previously entered data.

The outputs of the data gate G3 and feedback gate G4 are in turn gated through disjunctive gate G5, a NOR gate, so that the latch output Y is the inverse of the input signal D in the transmitting mode. To provide an output in phase with the input, the latch output Y is coupled through an inverting buffer or output gate G7 which may provide TTL compatible impedance levels and more commonly a tri-state output operated by an apropriate output enable (OE) control signal for interfacing with bus-organized systems as described above with reference to FIG. 2.

TRUTH TABLE I

| | | | | | G6 | G4 | G3 | Latch | |
|---|---|---|---|---|---|---|---|---|---|
| LE | X1 | X2 | D | Y | (out) | (out) | (out) | State | O |

CONVENTIONAL D LATCH (PRIOR ART)

| LE | X1 | X2 | D | Y | G6 (out) | G4 (out) | G3 (out) | Latch State | O |
|---|---|---|---|---|---|---|---|---|---|
| H | L | H | H | L | H | L | H | Transmit | H |
| H | L | H | L | H | L | L | L | Transmit | L |
| L | H | L | H | $Y_o$ | $Y_{inv}$ | $Y_{inv}$ | L | Latching | $Y_{inv}$ |
| L | H | L | L | $Y_o$ | $Y_{inv}$ | $Y_{inv}$ | L | Latching | $Y_{inv}$ |

A truth table for the conventional D latch is presented in Table I, with reference to which the operation will be described in further detail. In Table I the designation $Y_0$ in the latching state or latching mode denotes that the output Y of the latch remains in the same data state as it did prior to the transition at LE from high level voltage (H) to low level voltage (L) while the designation $Y_{inv}$ is the inverse of $Y_o$. Referring to the Table I, when LE is high, control signal X1 will be low and control signal X2 high. Since X1 is low, the output of AND gate G4 will be low, that is the positive feedback data signal will be blocked. Further, because X2 is high the output of data gate G3 transmits the value of D. The output of NOR gate G5 that is the latch output Y will therefore be the logical inverse of AND gate G3. Therefore, $Y=\bar{D}$ when LE=H.

On the other hand, when LE is low, X1 will be high and X2 will be low. When X2 is low, the output of data gate G3 is low and the data gate is disabled, blocking the data input at D. Since X1 is high, the enabled feedback gate G4 passes the feedback signal which is the output of inverter gate G6. That is, feedback gate G4 is enabled to pass the positive feedback signal for latching the value of Y previously entered. Thus, in the latching state or mode, the output of inverting gate G6 is the inverse of output Y and passes through feedback gate G4 and is inverted once again at the disjunctive NOR gate G5 so that the previous value of Y is "latched" and temporarily stored until LE undergoes a transition from low to high. In the latching condition when Y is high, the output of G6 is low forcing the G4 output low thus holding Y high in the final inversion through gate G5. When Y is low, G6 output is high forcing the G4 output high and holding Y low after the final inversion through gate G5.

A number of disadvantages accompany the conventional data latches. As illustrated and described above the conventional latch requires two control lines, X1 and X2 derived from the latch enable signal LE through multiple inverting gates. This complicates the interconnection of components when the control lines operate a multiplicity of latches particularly in integrated circuit design where the double control lines must be routed around multiple latches consuming space and increasing cost. Control of the latches with only a single line would be preferable. Because the lines X1 and X2 are always of opposite value, one line is actually redundant, carrying redundant information. However, to reduce the number of lines in the conventional prior art latch requires an increase in the number of inverters in the latch. The importance of minimizing interconnections and reducing the control lines to one increases as the number of latches increases and the problems are compounded.

The prior art latch also suffers a "race condition" during which the device will momentarily go into an incorrect state at the output under certain input conditions producing an undesirable perturbation or "glitch" in the output. The race condition occurs when the latch enable input LE undergoes a transition from low to high level, voltage, that is a transition from the latching condition to the transmitting condition, after a high level binary 1 at the input D has been latched or temporarily stored in the device during the previous data transaction. With the D input high level binary 1, the latch output Y is low and the buffer output $V_{out}$ is high. Since a high value is the result of the previous transaction latched in the device, and the transition of LE from low to high loads a high level signal at the input to the data gate G3, the output $V_{out}$ should remain unchanged at a high level. What actually happens instead is that the output $V_{out}$ momentarily goes low and then returns high producing a "glitch" 25 in the output as shown in the graph of FIG. 3.

This glitch, which lasts in the order of three nanoseconds (ns) in the case of Low Power Schottky TTL technology, occurs because of the delay in the latch enable signal through gate G1 and G2. With $t_{1+}$ and $t_{1-}$ representing the delay through gate G1 when changing respectively from low to high and high to low, and with $t_{2+}$ and $t_{2-}$ representing the delay through gate G2 during change respectively from low to high and high to low, then if LE undergoes a transition from low to high, X1 goes from high to low a time $t_{1-}$ later. At the time $t_{1-}+t_{2+}$ after LE changes, X2 will go from low to high. During the time interval from $t_{1-}$ to $t_{1-}+t_{2+}$, however, both X1 and X2 will be low. These two low level signals will force the outputs of data gate G3 and feedback gate G4 to a low level so that latch output Y goes high, and the output $V_{out}$ goes low. After the time period $t_{1-}+t_{2+}$ has passed, X2 goes high. With high level signals at both D and X2 applied to data gate G3, the output of G3 goes high forcing Y to return low and thus the output $V_{out}$ to return high. This momentary low, in the order of 3 ns for the example of Low Power Schottky TTL technology, is an undesirable characteristic. The time duration of the glitch is the same order of magnitude as the 1–5 ns transition time ordinarily attained at the output in similar TTL technology during a transition for example from high to low at the output $V_{out}$ as illustrated in the graph of FIG. 3.

The delay in propagation of the signal through gates G1 and G2 in addition to causing the undesirable race condition and consequent glitches in the output, is also unnecessarily long since the inverter gates drive control lines which may go to several latches and hence will be loaded with a relatively large capacitance. Furthermore, the use of two inverter gates consumes more power than is necessary.

SUMMARY OF THE INVENTION

It is therefore an object of the present invention to provide new and improved data latching devices which reduce the number of enable signal control lines in the latch supporting circuitry to one, thereby eliminating redundant lines without requiring additional inverting gates, and thereby also simplifying the design and fabrication of multiple internal D latch devices in integrated circuits.

Another object of the invention is to eliminate one of the inverters in the latch enable control gate supporting circuitry for latching devices, simplifying fabrication and lowering costs. By reducing the number of control gates the invention thereby also intends to reduce power consumption.

A further object of the invention is to avoid the "race condition" and consequent undesirable glitch in the latch output due to the delay introduced by unnecessary inverter gates in the latch enable control line for latching devices.

It is the intent of the invention to achieve all these advantages in new and improved data latches with all the functional capabilities of existing D latches and adaptable for TTL, DTL and tristate output devices for common bus output applications.

In order to accomplish these results the present invention contemplates providing a new and improved data latch of the kind having at least two operative modes, a transmitting or transparent mode or condition for transmitting data signals through the latch, and a latching mode or condition for latching and temporary storage by feedback of data signals in the latch. According to the invention there is provided in the data latch a pregate means for pregating feedback data signals in the latch. The pregate is adapted and coupled to provide positive feedback data signals for reinforcing previously entered data in the latching mode, and gating signals for passing input data in the transmitting mode.

More particularly, the data latching device or D latch is of the type including input data gate means, feedback gate means, means providing positive feedback from the latch output to the feedback gate, and enable gating signal means to provide enable gating signals for switching the data latch between the transmitting and latching states. According to the improvement contemplated by the present invention, the means providing positive feedback from the latch output to the feedback gate comprises novel pregate means with input coupled to the data latch output and the enable gating signal means for pregating the feedback signal with the enable gating signal. The novel pregate output is coupled to the feedback gate for providing positive feedback data signals for reinforcing and storing existing data in the latching mode, and also coupled to the data gate to provide a gating signal for passing input data signals in the transmitting mode.

A feature and advantage of this arrangement is that the enable gating signal means is coupled to provide a gating signal to the feedback gate and is not coupled to the data gate so that only one associated control line and inverter gate is required. Furthermore, the same enable gating signal which gates the feedback signal at the feedback gate also controls the pregating of the feedback signal at the pregate so that only one associated inverter gate is required in the latch enable control line. The novel feedback arrangement and resulting data latch so contemplated by the present invention is functionally equivalent with existing latches in that the data gate is enabled to pass data signals and the feedback gate is disabled during the transmitting mode, and the feedback gate is enabled during the latching mode for positively reinforcing and storing existing data in the latch. Yet by means of the novel arrangements of the invention a latch enable control line and inverter gate are eliminated for simplification of circuitry in integrated circuit applications, power consumption is reduced, and race condition induced glitches in the output caused by unnecessary inverter gate delay is eliminated.

The invention also contemplates using a disjunctive gate means coupled to the data and feedback gate for passing either input data signals or feedback data signals according to whether the data latch is in the transmitting state or the latching state. According to the preferred embodiment, the latch is designed and gates selected so that the signal delay through the pregate is less than the combined signal delay through the feedback gate and the disjunctive gate.

In the illustrated example the data gate and feedback gate are implemented by AND gates, the disjunctive gate comprises a NOR gate and the pregate comprises a NAND gate. The latch elements are implemented by active and passive logic circuit elements and associated resistances where the respective resistance values are selected so that the pregate operates faster than the combined operating times of the feedback gate and the disjunctive gate. A feature and advantage of this arrangement is that race conditions in the gates are avoided, thereby avoiding the problem of latching in the wrong condition or introducing glitches in the output signal.

Thus, the present invention differs significantly in implementation of the latch functions from conventional latches where gating control of the state or condition of the latch is accomplished by two enable signals from two control lines and two inverter gates in the external circuitry. Positive feedback in the prior art gate is by invariable inversion of the latch output Y which is in turn the inverse of the data input D. Thus, the feedback signal is always the inverse of $Y = \overline{D}$. According to the present invention a single enable signal from a single control line and inverter gate in the external circuitry controls the state or condition of the latch. This is the result of the introduction by the present invention of a novel pregate for pregating the feedback signal from $Y = \overline{D}$. That is, the data out, $\overline{D}$, is itself pregated using the single enable signal from the external circuitry. The feedback signal is therefore no longer an invariable inversion of the data out but is also a function of the latch enable signal.

An outstanding feature of the present invention is that the novel pregate output provides both the positive feedback signal to be gated at the feedback gate, and also a gating signal applied to the data gate for passing and transmitting data signals in the transmitting mode. The second latch enable signal control line and inverter gate required by prior art latches for the gating signal at the data latch is thereby eliminated. Yet the details of the logical function of the novel arrangement is such that it provides the functional equivalent of the prior art latches at the output, but by far more advantageous means.

Other objects features and advantages of the present invention will become apparent in the following specification and accompanying drawings.

DESCRIPTION OF THE PREFERRED EMBODIMENTS

Figure 2:
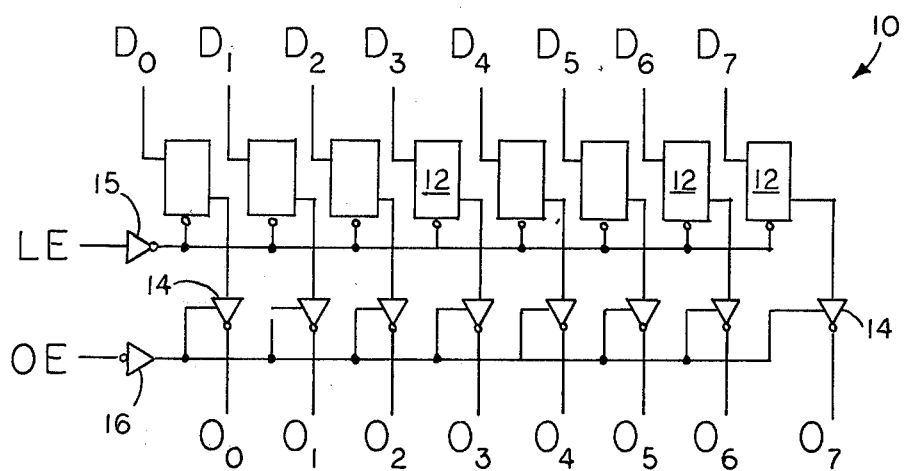
FIG. 2 is a schematic diagram of an octal transparent latch as known in the prior art showing application of data latches in association with tristate output devices or buffers for application on a common bus.
Figure 4:
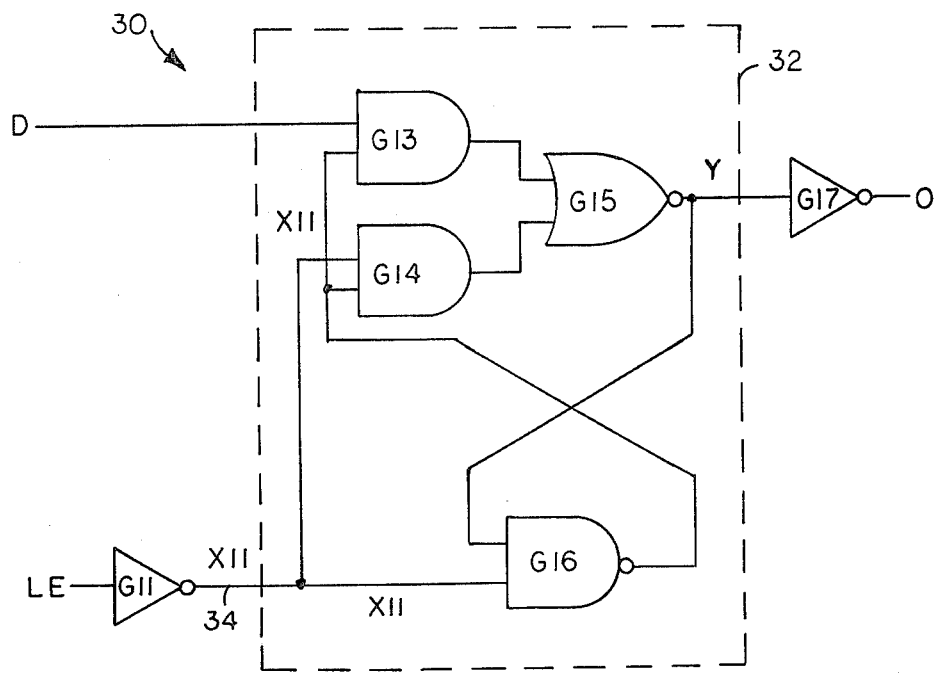
FIG. 4 is a logic diagram of a data latch in accordance with the present invention.
Figure 3:
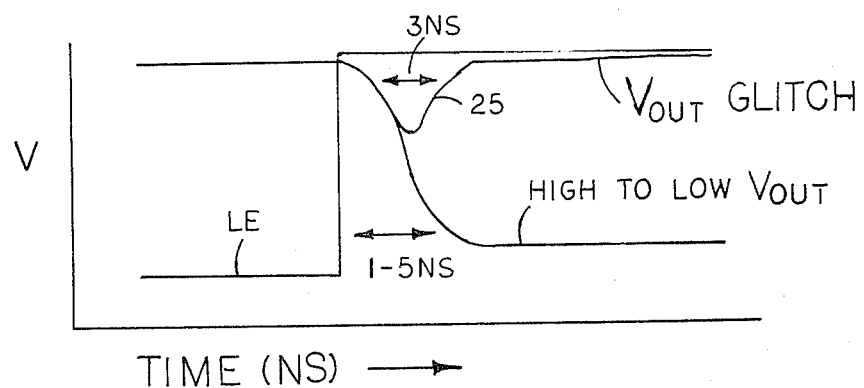
FIG. 3 is a graph of operating parameters of a prior art data latch showing the output glitch produced by undesirable race conditions associated with such prior art devices.

A data latching device, data latch, or D latch 30 embodying the present invention is illustrated in the logic diagram of FIG. 4 in which the latch itself is enclosed within the dashed line box 32 with supporting circuitry outside. While the present invention includes some elements in common with the prior art data latch of FIG. 2, the differing elements and differing functions of common elements is presented in the following description of the preferred embodiment. The latch 30 of FIG. 4 includes a data input line D and input data gate G13 similar to G3 of FIG. 2 but with different gating control as hereafter described. The feedback gate G14 also includes functional inputs different from the conventional latch feedback gate G4 of FIG. 2. Both gates G13 and G14 are AND gates and feed into disjunctive NOR gate G15 which passes and inverts either a data input signal from gate G13 or a feedback signal from gate G14 according to whether the latch is in a transmitting mode or a latching mode. The output signal Y which is the inverse $\overline{D}$ of the data input signal D during the transmitting mode is buffered and inverted by output device or buffer G17 which serves the same function as buffer G7 in the latch device of FIG. 2.

The significant and advantageous differences of the embodiment of FIG. 4 from the prior art latch arise particularly with reference to the positive feedback circuit elements and function and the enable gating signal elements and function. The output Y of latch 30 is fed back to the feedback gate G14 by way of novel pregate G16 which is coupled into the latch in such a way as to provide different and improved operation. Pregate G16 is a NAND gate one of whose inputs is coupled to the output Y. The other input to pregate G16, the gating signal input, is coupled through the single inverting delay element G11 to the latch enable signal input LE.

An important feature of the latch embodiment 30 of the present invention is that only a single latch enable control line 34 into the latch 30 for controlling the operative mode of the latch either transmitting or latching is required. This single line from latch enable input signal LE passes through a single inverting delay G11 and is coupled both to the pregate G16 as heretofore described and to the feedback gate G14. The signal X11 thus provides the gating signal for pregate G16 and feedback gate G14. The latch enable input through inverting delays no longer directly controls the gating of the input data gate G13. Instead, according to the preferred embodiment of the present invention, the output of the pregate G16 provides the gating signal for data gate G13 and also provides the positive feedback signal to the feedback gate G14. The latch device therefore operates in a significantly different manner avoiding the drawbacks of prior art latches while at the same time providing functionally equivalent output as now described with reference to the following Table II.

TRUTH TABLE II
D LATCH PREFERRED EMBODIMENT

| LE | X11 | D | Y | G16 (out) | G14 (out) | G13 (out) | LATCH STATE | O |
|----|-----|---|---|-----------|-----------|-----------|-------------|---|
| H  | L   | H | L | H         | L         | H         | Transmit    | H |
| H  | L   | L | H | H         | L         | L         | Transmit    | L |
| L  | H   | H or L | $Y_o(L)$ | $Y_{inv}(H)$ | $Y_{inv}(H)$ | H or L | Latch | $Y_{inv}$ |
| L  | H   | H or L | $Y_o(H)$ | $Y_{inv}(L)$ | $Y_{inv}(L)$ | $Y_{inv}(L)$ | Latch | $Y_{inv}$ |

The notation of Table II includes the output notation $Y_o$ which represents the value of Y previously entered, that is the value of Y prior to the present transition of LE to a low level initiating the latching sequence. $Y_o(L)$ represents the case where the previously entered value of Y is low and $Y_o(H)$ represents the case in which the previous value of Y is high. Similarly, $Y_{inv}$ denotes the inverse of $Y_o$. Thus, $Y_{inv}(H)$ represents the case where $Y_{inv}$ is high and this would be the opposite logical value from $Y_o$ which would be low in that case. $Y_{inv}(L)$ repesents the case where $Y_{inv}$ is low. During the latching mode, the value of Y is latched at the previous value whatever the data input D. Thus, as shown in the Table II, the input at D may be either H or L, that is high or low and the latched value remains at the same level during the "Latch State". In the case of $Y_o(L)$, the high or low data signal at D passes through the data gate G13 appearing at the output of G13 as shown on the Table, but is blocked instead by the disjunctive NOR gate G15 so that Y remains latched at the low level.

Referring to Table II and the logic diagram of FIG. 4, the latch enable signal LE through single delay and inverting gate G11 provides the single control signal X11 that controls the state or mode of the latch. Thus, when LE is high (H), the control signal X11 enables the latch to receive and transmit data, and when LE is low (L), disables the latch so that previously entered data is latched and new data cannot be entered.

More particularly, when the LE input is high, control signal X11 is low. This forces the output of pregate G16 high and the output of feedback gate G14 low. Since the output of pregate 16 is connected to the input of data gate G13, the output of G13 will follow the value of D, that is it will pass the data input signal level. The outputs of data gate G13 and feedback gate G14 are tied through disjunctive NOR gate G15, and since the output of G14 is low, the output of NOR gate G15 will be the inverse of the output of data gate G13, i.e. it will be the inverse of the value of the data input D. Consequently, $Y=\overline{D}$ if LE=H, verifying the functional equivalence at the output with the first two lines of Table I.

When LE is low, X11 is high enabling the pregate G16 so that the output of G16 will be the logical inverse of the value of output Y thereby providing the positive feedback signal to feedback gate G14. If Y is high, the output of G16 is low. This low signal applied to the gate of G14 as the positive feedback signal and also applied to the data gate G13 as a gating signal causes the outputs of G14 and G13 to be low which after inversion by NOR gate G15 will keep Y high latching the previously entered value at Y. If Y is low, the output of pregate G16 will be high so that the output of NOR gate G15 will remain low, latching the previous value entered at Y. Thus, the equivalence with the output of the prior art latch set forth in the second two lines of Table I is also demonstrated.

Figure 1:
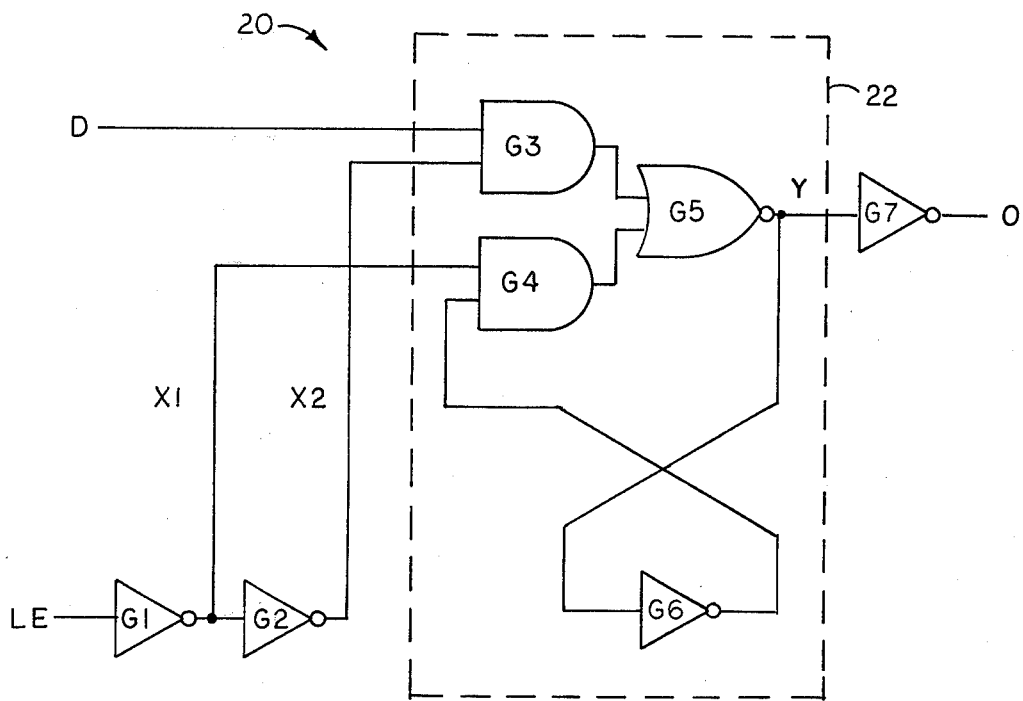
FIG. 1 is a logic diagram of a prior art data latching device also known as a D latch.

It can be seen that while there is functional equivalence between the outputs of the latch devices of FIGS. 1 and 4, the operational features are significantly different. Thus, the single latch enable signal LE through gate G11 of the present invention provides the control gating signal X11 for both the pregate G16 and feedback gate G14 and does not directly control the data gate G13. The novel pregate G16 introduced into the latch of the present invention provides the gating signal for data gate G13 and the positive feedback signal for the data gate G14. This positive feedback signal is no longer the simple inverse of Y as it is in the prior art latch. Rather it is additionally a function of the latch enable signal LE and control signal X11 as verified by the truth table. Furthermore, gating of the data input D does not entirely take place at data gate G13. Thus, when LE is low and the device is in the latching mode, data gate G13 may still pass data when Y is also low and the output of G16 high. This data is however blocked at NOR gate G15 which must remain low because of the high at G14. Thus, the differences in operation still afford the same functional results for latch applications in data processing circuits while avoiding the drawbacks of the additional circuit elements required in the conventional latches.

In order to provide "glitchless" operation of the latch according to the invention, it should be designed so that any delay in signal propagation introduced by pregate G16 should be less than the combined delay introduced by the feedback gate G14 and disjunctive gate G15. That is, the pregate should operate faster than the combined time of the feedback gate and the disjunctive gate. To understand this preferred design feature further, consider the transition when LE goes low and X11 high if D was low and Y high previous to the transition. When X11 goes high, the output of pregate G16 will go low a time $t_{16-}$ later. During the time before G16 has gone low, the high at X11 causes the output of feedback gate G14 to go high a time $t_{14+}$ later. This will cause NOR gate G15 to go low a time $t_{15-}$ later still. If the time of $t_{16-}$ is longer than the combined times $t_{14+}+t_{15-}$, Y will latch in the wrong state. If $t_{16-}$ is about the same time as $t_{14+}+t_{15-}$, then Y may glitch low. It is therefore a proper design feature of the present invention that the time $t_{16-}$ be less than the combined times $t_{14+}+t_{15-}$. This is easily achieved by well known circuit design techniques.

Figure 5:
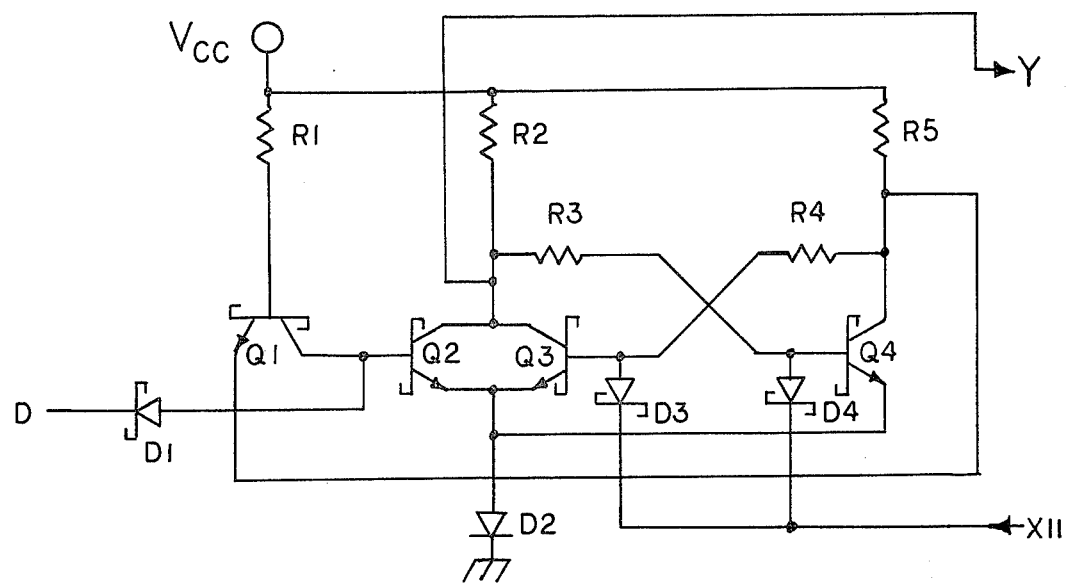
FIG. 5 is a schematic diagram of a data latch of kind described with reference to FIG. 4 implemented by active and passive TTL logic elements and associated resistors.

FIG. 5 shows a schematic for an LSTTL circuit implementation of the logic diagram shown in FIG. 4. The circuit shown is the portion within the dashed box of FIG. 4. The lines labelled Y and X11 correspond to the similarly labelled lines in FIG. 4. Transistor Q1, resistor R1, and diode D1 comprise G13 of FIG. 4, where the collector of Q1 is the output of G13. Diode D3 and resistor R4 form gate G14. Transistor Q2 and Q3 and resistor R2 form gate G15. The output of G15 is the collectors of the two transistors. Diode D4, resistor R3, and transistor Q4 and resistor R5 comprise gate G16 whose output is the collector of Q4.

When D is low, Q2 is held off and Q1 is placed in the inverse active mode (which means it is essentially off since it is a schottky clamped transistor). If LE now goes low to high, both Q3 and Q4 will try to turn on simultaneously. Since D was low, Q4 should turn on and thus turn off Q3. It is necessary that this occur without the voltage at the collector of Q3 dropping low enough to cause a response in gate G17. This can be accomplished by making R4 smaller than R3 to ensure that Q3 will turn off faster than Q4 and by making R2 smaller than R5 to ensure that the collector of Q3 will rise faster than the collector of Q4. It should be noted, however, that the ratio of R2 to R3 determines the high level voltage at the collector of Q3. The maximum value that this ratio (R2/R3) can be is determined by the voltage level at the input of G17 required to make G17 go low. The exact values of R2, R3, R4 and R5 chosen depend upon the speed requirements of the latch and the power restriction.

Figure 6:
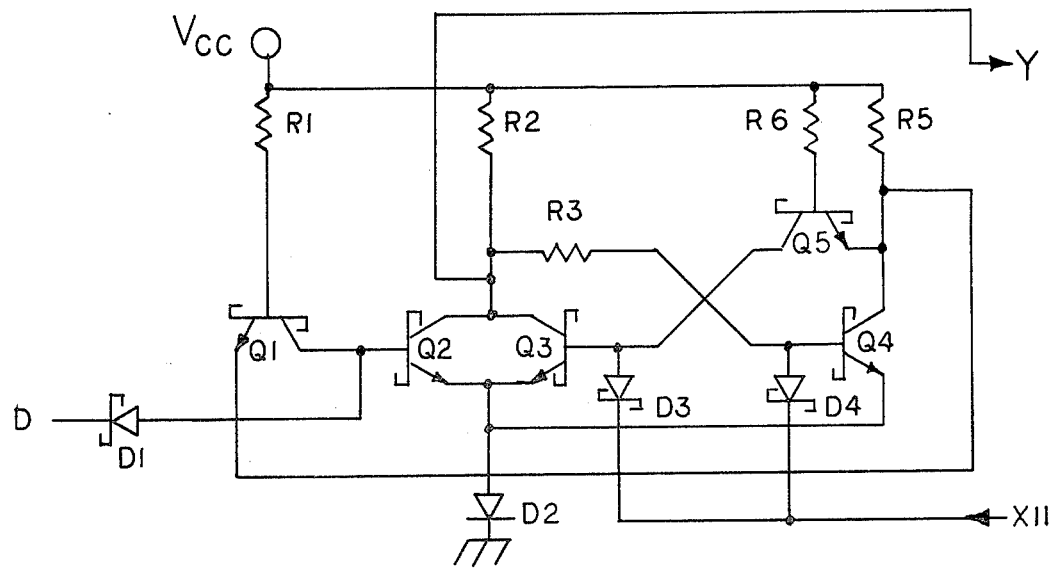
FIG. 6 is a schematic diagram of another data latch with alternative circuit elements for achieving a lower resistance feedback path in the latch.

Another of several possible ways to modify the circuit in FIG. 5 is shown in FIG. 6. Resistor R4 has been replaced by transistor Q5 and resistor R6. This combination provides an active low impedance discharge at the base of Q3 and thus guarantees a very fast turn off.

In either case the latch is implemented by active and passive logic circuit elements and associated resistances and the respective resistance values are selected so that the pregate operates faster than the combined operating times of the feedback gate and the disjunctive gate. Latching in the wrong state or glitching in the output signal is thereby avoided. It is apparent that a variety of circuit elements in the solid state and integrated circuit art may be constructed in a variety of arrangements to implement the invention here set forth.

I claim:

1. In a new and improved data latch having an input and output and at least two operative modes, a transmitting or transparent mode for transmitting data signals through the latch and a latching mode for latching and temporary storage by feedback of data signals in the latch, said data latch including enable gating signal means for switching the data latch between the transmitting and latching modes, the improvement comprising:

pregate means for pregating feedback data signals in the latch, said pregate means operatively coupled to the data latch output and enable gating signal means to provide positive feedback data signals in the latching mode, said pregate means also operatively coupled to provide gating signals for passing data in the transmitting mode.

2. In a data latch with data signal input and output, said data latch having at least two operative states, a transmitting or transparent state for transmitting data signals from the latch input to the output and a latching state for latching and temporary storage of data received at the input, said latch including input data gate means, feedback gate means, means providing positive signal feedback from the data latch output to the feedback gate means, and enable gating signal means to provide enable gating signals for switching the data latch between the transmitting and latching states, the improvement comprising:

pregate means operatively coupled at its input to the data latch output and the enable gating signal means for pregating feedback signals from the data latch output with enable gating signals, said pregate means having an output operatively coupled to the feedback gate means to provide positive feedback signals to the feedback gate means in the latching state and also operatively coupled to the input data gate means to provide gating signals to the input data gate means for passing input data signals in the transmitting state.

3. In a data latch with data signal input and output, said latch of the kind having at least two operative states, a transmitting or transparent state or mode for transmitting data signals from the latch input to the output and a latching state or mode for latching and temporary storage of data received at the input, said latch including input data gate means, feedback gate means, means providing positive signal feedback from the data latch output of the feedback gate means, and enable gating signal means to provide enable gating signals for switching the data latch between the transmitting and latching states the improvement comprising:

means means providing positive signal feedback comprising pregate means with input coupled to the data latch output and the enable gating signal means for pregating the feedback signal, said pregate means output coupled to the feedback gate means for providing positive feedback data signals in the latching mode, said pregate means output also coupled to the input data gate means to provide a gating signal for passing input data signals in the transmitting mode, said enable gating signal means coupled to provide the gating signal to the feedback gate means, whereby the input data gate means is enabled to pass data signals and the feedback gate means is disabled during the transmitting mode and whereby the feedback gate means is enabled during the latching mode for positively reinforcing and storing the previously entered data.

4. A data latch as set forth in claim 3 wherein is also included disjunctive gate means coupled to the input data gate means and feedback gate means for passing either input data signals or feedback signals according to whether the data latch is in the transmitting state or the latching state.

5. A data latch as set forth in claim 4 wherein the gate means are formed so that the signal delay through the pregate means is less than or equal to the combined signal delay time through the feedback gate means and the disjunctive gate means.

6. A data latch as set forth in claim 5 wherein said data gate means and feedback gate means comprise AND gates, said disjunctive gate means comprises a NOR gate, and said pregate means comprises a NAND gate.

7. A data latch as set forth in claim 3 wherein said data latch is comprised of active and passive logic circuit elements and associated resistances and where the respective resistance values are selected so that the pregate means operates faster than the combined operating times of the feedback gate means and the disjunctive gate means, whereby glitches in the output signal caused by race conditions in the gates are avoided.

8. A data latch as set forth in claim 3 wherein said enable gating signal means comprises a single control line coupling means at the data latch.

9. A data latch with data signal input and output, said latch of the kind having at least two operative states, a transmitting or transparent state for transmitting data signals from the latch input to the output and a latching state for latching and temporary storage of data received at the input, said latch comprising:

input data gate means for gating data signals at the latch input;

feedback gate means for gating signals fed back from the latch output;

means providing positive signal feedback from the data latch output to the feedback gate means, said positive signal feedback means comprising pregate means for pregating feedback signals from the data latch output, said pregate means output coupled to the feedback gate means for providing a positive feedback data signal, said pregate means output also coupled to the input data gate means to provide a gating signal for the input data gate means;

enable gating signal means for switching the data latch between the transmitting and latching states, said enable gating signal means coupled to the feedback gate means for gating positive feedback signals from the latch output and pregate means, said enable gating signal means also coupled to the pregate means for pregating feedback signals;

and disjunctive gate means coupled to the outputs of the input data gate means and the feedback gate means for passing either input data signals or feedback signals according to whether the data latch is in the transmitting state or the latching state.

10. A data latch as set forth in claim 9 wherein said input data gate means comprises an AND gate, said feedback gate means comprises an AND gate, said disjunctive gate means comprises a NOR gate, and said pregate means comprises a NAND gate.

11. A data latch as set forth in claim 9 or claim 10 wherein said gate means are selected and arranged so that the signal delay through the pregate means is less than the combined delay through the feedback gate means and the disjunctive gate means, thereby avoiding race condition glitches in the latch output signal.

12. A data latch as set forth in claim 9 wherein said data latch is comprised of active and passive logic circuit elements and associated resistances and where the respective resistance values are selected so that the pregate means operates faster than the combined operating times of the feedback gate means and the disjunctive gate means, whereby glitches in the output signal caused by race conditions in the gate means are avoided.

13. A data latch as set forth in claim 12 wherein said active and passive circuit elements comprise TTL logic circuit elements.

14. A data latch as set forth in claim 9 wherein said enable gating signal means comprises a single control line coupling means at the data latch.

* * * * *